United States Patent
Fulkerson

(10) Patent No.: US 6,535,017 B1
(45) Date of Patent: Mar. 18, 2003

(54) CMOS ECL INPUT BUFFER

(75) Inventor: David E. Fulkerson, Chanhassen, MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 10/027,676

(22) Filed: Dec. 20, 2001

(51) Int. Cl.$^7$ .......................................... H03K 19/0175
(52) U.S. Cl. ............................. 326/66; 326/73; 327/89; 330/253
(58) Field of Search ........................... 326/66, 73, 77, 326/83; 327/89, 88, 55, 56; 330/252, 253

(56) References Cited

U.S. PATENT DOCUMENTS 5,332,935 A * 7/1994 Shyu ........................ 307/475
5,469,097 A * 11/1995 Ho .............................. 327/170

FOREIGN PATENT DOCUMENTS

JP         401062017 A * 3/1989 .................. 326/73

* cited by examiner

*Primary Examiner*—Daniel D. Chang
(74) *Attorney, Agent, or Firm*—Schiff Hardin & Waite

(57) ABSTRACT

A CMOS ECL input buffer buffers signals from an ECL circuit to a CMOS circuit. The CMOS ECL input buffer has a CMOS differential amplifier. A CMOS input circuit is coupled between a buffer input that receives the ECL circuit and a first input of the CMOS differential amplifier. The CMOS input circuit couples an input signal to the first input of the CMOS differential amplifier, and the input signal has an input voltage swing. A reference circuit provides a reference to a second input of the CMOS differential amplifier. The reference is nominally set at substantially a midpoint of the input voltage swing. A CMOS output circuit is coupled between the output of the CMOS differential amplifier and the buffer output, and is arranged to provide an output signal to the buffer output. The output signal, in response to the CMOS differential amplifier, swings between a typical CMOS positive source voltage and ground as the input signal traverses the reference.

22 Claims, 2 Drawing Sheets

CMOS ECL INPUT BUFFER

The U.S. Government may have a paid-up license in this invention and the right in limited circumstances to require the patent owner to license others on reasonable terms as provided for by the terms of a sub-contract with Raytheon having contract number V7-6T0189S.

TECHNICAL FIELD OF THE INVENTION

The present invention relates to a buffer that can be used to couple signals from an ECL (emitter coupled logic) circuit to a CMOS circuit.

BACKGROUND OF THE INVENTION

ECL typically uses bipolar transistor technology rather than CMOS technology. Therefore, ECL specifications are usually written around bipolar capabilities. As part of these specifications, ECL traditionally operates with a negative power supply (such as −5V). On the other hand, CMOS integrated circuits typically operate with a positive power supply (such as 5V or 3.3V). Thus, a standard ECL circuit is not generally compatible with a CMOS circuit without the use of a buffer between the two circuits.

While buffers that transfer signals from one circuit to another are generally known, care must be taken in providing a buffer between CMOS and ECL circuits because the transistors of a buffer operating at a large negative voltage, such as that used by an ECL circuit, are less tolerant of total dose radiation.

The present invention, therefore, is directed to an input buffer to a CMOS circuit that allows the CMOS circuit to accept input signals from an ECL circuit and that is more tolerant of total dose radiation than existing ECL to CMOS buffers. Such a buffer may be part of an integrated circuit, or it may be an entirely separate integrated circuit dedicated solely to driving signal lines.

SUMMARY OF THE INVENTION

In accordance with one aspect of the present invention, a CMOS ECL input buffer has a buffer input and a buffer output. The buffer input receives signals from an ECL circuit, and the buffer output provides an output signal to a CMOS circuit in response to the input signal from the ECL circuit. The CMOS ECL input buffer comprises a CMOS differential amplifier, a CMOS input circuit, a reference circuit, and a CMOS output circuit. The CMOS differential amplifier has first and second inputs and an output. The CMOS input circuit is coupled between the buffer input and the first input of the CMOS differential amplifier so as to couple the input signal to the first input of the CMOS differential amplifier. The input signal has an input voltage swing. The reference circuit provides a reference to the second input of the CMOS differential amplifier. The reference is nominally set at substantially a midpoint of the input voltage swing. The CMOS output circuit is coupled between the output of the CMOS differential amplifier and the buffer output so as to provide the output signal to the buffer output. The output signal, in response to the CMOS differential amplifier, swings between a typical CMOS positive source voltage and ground as the input signal traverses the reference.

In accordance with another aspect of the present invention, a CMOS ECL input buffer chip has a buffer input and a buffer output. The buffer input receives signals from an ECL circuit, and the buffer output provides an output signal to a CMOS circuit in response to the input signal from the ECL circuit. The CMOS ECL input buffer chip comprises a CMOS amplifier, first and second p-channel source followers, and a capacitor. The CMOS amplifier has a cross coupled active load, first and second inputs, and an output. The cross coupled load includes a cascode section. The first p-channel source follower couples the buffer input to the first input of the CMOS amplifier. The second p-channel source follower couples a reference to the second input of the CMOS amplifier. The capacitor filters out ground noise due to simultaneous switching of CMOS circuits on the CMOS ECL input buffer chip.

In accordance with yet another aspect of the present invention, a method of buffering a signal between an input ECL circuit and an output CMOS circuit comprises the following: level shifting an input signal up through a p-channel source follower and supplying the level shifted input signal to a first input of a CMOS differential amplifier, wherein the input signal is from the ECL circuit, and wherein the input signal has an input signal swing; level shifting a reference up through a p-channel source follower and supplying the level shifted reference to a second input of the CMOS differential amplifier, wherein the reference is substantially midway in the input signal swing; and, coupling an output of a cross coupled active load of the CMOS differential amplifier to an output terminal connectable to the output CMOS circuit, wherein the cross coupled active load provides a high gain at a balance point between the input signal and the reference.

BRIEF DESCRIPTION OF THE DRAWINGS

These and other features and advantages will become more apparent from a detailed consideration of the invention when taken in conjunction with the drawings in which.

DETAILED DESCRIPTION

Figure 1:
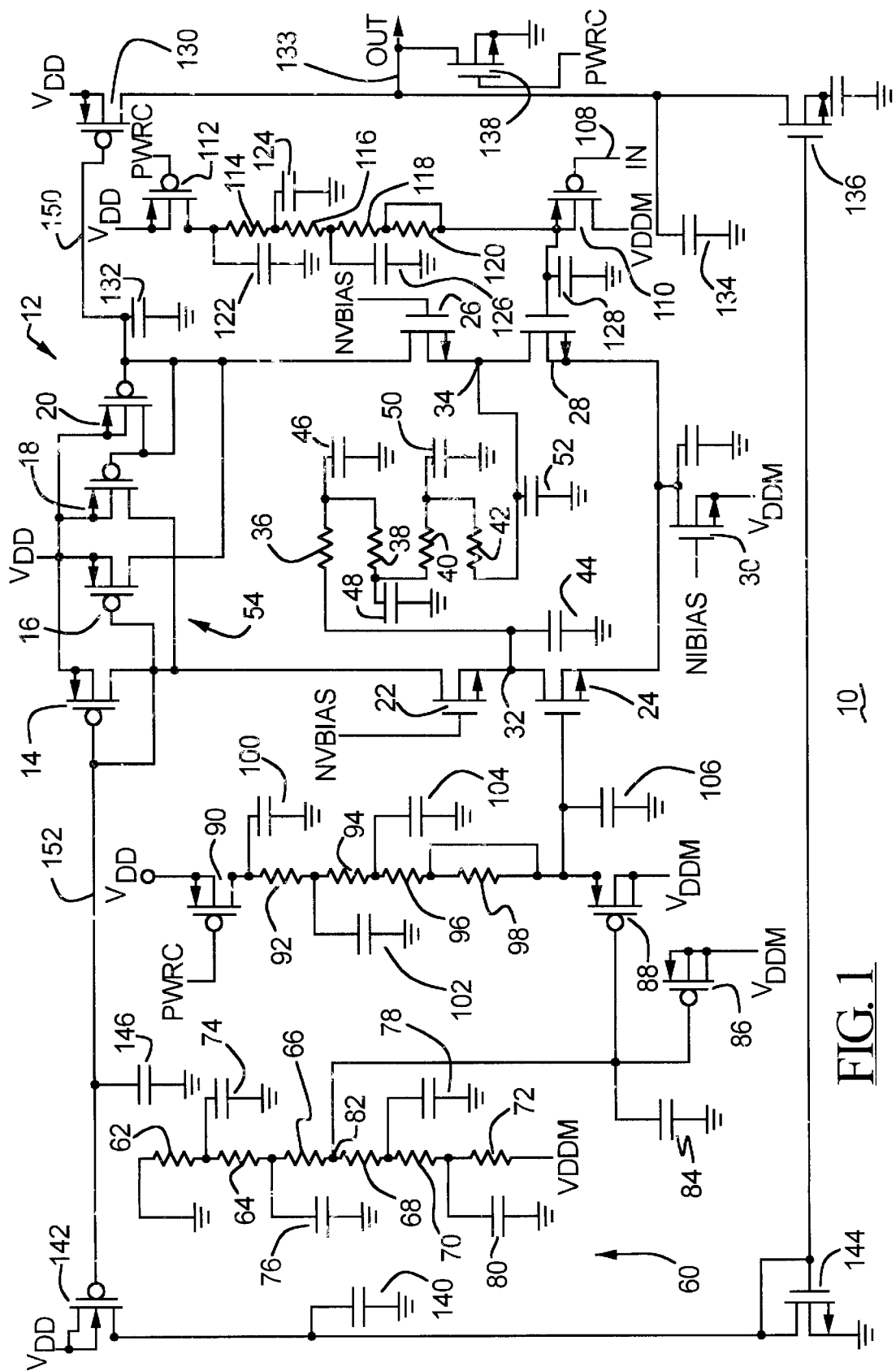
FIG. 1 illustrates a CMOS ECL input buffer according to one embodiment of the present invention.

A CMOS ECL input buffer 10 according to one embodiment of the present invention uses CMOS transistors and is illustrated in FIG. 1 as a single chip. The CMOS ECL input buffer 10 includes a differential amplifier 12 having transistors 14, 16, 18, 20, 22, 24, 26, 28, 30, 88, and 110. The gates of the transistors 14 and 16 are coupled together and to the source/drain circuit of the transistor 22. Similarly, the gates of the transistors 18 and 20 are coupled together and to the source/drain circuit of the transistor 26.

The source/drain circuit of the transistor 14, the source/drain circuit of the transistor 22, the source/drain circuit of the transistor 24, and the source/drain circuit of the transistor 30 are coupled in series between a source $V_{DD}$ and a source $V_{DDM}$. The source $V_{DD}$, for example, may be +3.3V, a typical positive power supply for CMOS integrated circuits. The source $V_{DDM}$, for example, may be −2V, a typical negative termination supply voltage.

Similarly, the source/drain circuit of the transistor 20, the source/drain circuit of the transistor 26, the source/drain circuit of the transistor 28, and the source/drain circuit of the transistor 30 are coupled in series between the source $V_{DD}$ and the source $V_{DDM}$. The gate of the transistor 30 is coupled to NIBIAS.

The source/drain circuit of the transistor 16 is coupled from the source $V_{DD}$ to the gates of the transistors 18 and 20 and to the source/drain circuit of the transistor 26. Similarly, the source/drain circuit of the transistor 18 is coupled from the source $V_{DD}$ to the gates of the transistors 14 and 16 and to the source/drain circuit of the transistor 22. The gates of the transistors 22 and 26 are coupled to NVBIAS.

The source/drain circuits of the transistors 22 and 24 form a junction 32 therebetween, and the source/drain circuits of the transistors 26 and 28 form a junction 34 therebetween. Resistors 36, 38, 40, and 42 are coupled in series between the junctions 32 and 34. The junction 32 is coupled to ground through a capacitor 44, the junction between the resistors 36 and 38 is coupled to ground through a capacitor 46, the junction between the resistors 38 and 40 is coupled to ground through a capacitor 48, the junction between the resistors 40 and 42 is coupled to ground through a capacitor 50, and the junction 34 is coupled to ground through a capacitor 52. The resistors 36–42 limit the voltage swing between the junctions 32 and 34, thereby increasing the speed of the circuit.

The transistors 14, 16, 18, and 20 form a cross-coupled active load 54 for the differential amplifier 12. The cross-coupled active load 54 of the differential amplifier 12 provides a very high voltage gain near the balance point between a reference and an input signal IN.

A reference circuit 60 in the form of a voltage divider establishes the reference at a desired level. The reference circuit 60 includes resistors 62, 64, 66, 68, 70, and 72 coupled in series between the source $V_{DDM}$ and ground. The junction between the resistors 62 and 64 is coupled to ground through a capacitor 74, the junction between the resistors 64 and 66 is coupled to ground through a capacitor 76, the junction between the resistors 68 and 70 is coupled to ground through a capacitor 78, and the junction between the resistors 70 and 72 is coupled to ground through a capacitor 80.

A junction 82 between the resistors 66 and 68 provides the reference. The junction 82 is coupled to ground through a capacitor 84, is coupled to the source $V_{DDM}$ through a capacitor 86, and is coupled to the gate of the transistor 88. The capacitor 86 is in the form of a very long transistor. For example, this transistor may have a length on the order of 36 microns, whereas the other transistors of the CMOS ECL input buffer 10 have a length on the order of 0.35 microns. The capacitor 86 is provided to filter out ground noise caused by the simultaneous switching of the CMOS circuits.

The source drain circuit of a transistor 90, resistors 92, 94, 96, and 98, and the source/drain circuit of the transistor 88 are coupled in series between the source $V_{DD}$ and the source $V_{DDM}$. The gate of the transistor 90 is coupled to receive a signal PWRC. The junction between the source/drain circuit of the transistor 90 and the resistor 92 is coupled to ground through a capacitor 100, the junction between the resistors 92 and 94 is coupled to ground through a capacitor 102, the junction between the resistors 94 and 96 is coupled to ground through a capacitor 104, and the junction between the source/drain circuit of the transistor 88 and the resistor 98 is coupled to ground through a capacitor 106 and to the gate of the transistor 24.

Accordingly, the reference established by the junction 82 is coupled to the differential amplifier 12 through the transistor 88 and is nominally set at a level that is at the mid-point of the input voltage swing at an input terminal 108. The input terminal 108 may be coupled to receive the input signal IN from the output of an ECL circuit.

The transistor 90, the resistors 92, 94, 96, and 98, and the transistor 88 act as a level shifter to shift the reference up to a suitable voltage level. As a result, the transistor 88, coupled as a p-channel source follower, provides an adequately high reference input bias to the differential amplifier 12.

The input terminal 108, which is coupled to the gate of a transistor 110, applies the input signal IN to the differential amplifier 12 by way of the transistor 110. The source drain circuit of a transistor 112, resistors 114, 116, 118, and 120, and the source/drain circuit of the transistor 110 are coupled in series between the source $V_{DD}$ and the source $V_{DDM}$.

The gate of the transistor 112 is coupled to receive the signal PWRC. The junction between the source/drain circuit of the transistor 112 and the resistor 114 is coupled to ground through a capacitor 122, the junction between the resistors 114 and 116 is coupled to ground through a capacitor 124, the junction between the resistors 116 and 118 is coupled to ground through a capacitor 126, and the junction between the source/drain circuit of the transistor 110 and the resistor 120 is coupled to ground through a capacitor 128 and to the gate of the transistor 28.

The transistor 112, the resistors 114, 116, 118, and 120, and the transistor 110 act as a level shifter to shift the input signal IN up to a suitable voltage level. As a result, the transistor 110, coupled as a p-channel source follower, provides an adequately high reference input bias to the differential amplifier 12.

Accordingly, the input signal IN is coupled to the differential amplifier 12 through the transistor 110 and is compared to the reference by the differential amplifier 12.

The gate of a transistor 130 is coupled to the gates of the transistors 18 and 20, to the source/drain circuit of the transistor 16, and to ground through a capacitor 132. The source/drain circuit of the transistor 130 is coupled between the source $V_{DD}$ and an output 133. The output 133 may be coupled to provide a signal OUT to the input of a CMOS circuit. The output terminal 133 is coupled to ground through a capacitor 134 and to ground through the source/drain circuit of a transistor 136. The output terminal OUT is also coupled to ground through the source/drain circuit of a transistor 138 whose gate is coupled to receive the signal PWRC.

The transistors 130 and 136 are the output transistors of the CMOS ECL input buffer 10. The transistors 130 and 136 and the differential amplifier 12 cause the signal OUT to swing rail ($V_{DD}$) to rail (ground) as the input signal IN traverses the reference.

The gate of the transistor 136 is coupled to the gate of a transistor 144. One side of a capacitor 140 is coupled to ground. The other side of the capacitor 140 is coupled to the source $V_{DD}$ through the source/drain circuit of a transistor 142, to ground through the source/drain circuit of the transistor 144, and to the gates of the transistors 136 and 144. The gate of the transistor 142 is couple to the gates of the transistors 14 and 16 and to ground through a capacitor 146.

Figure 3:
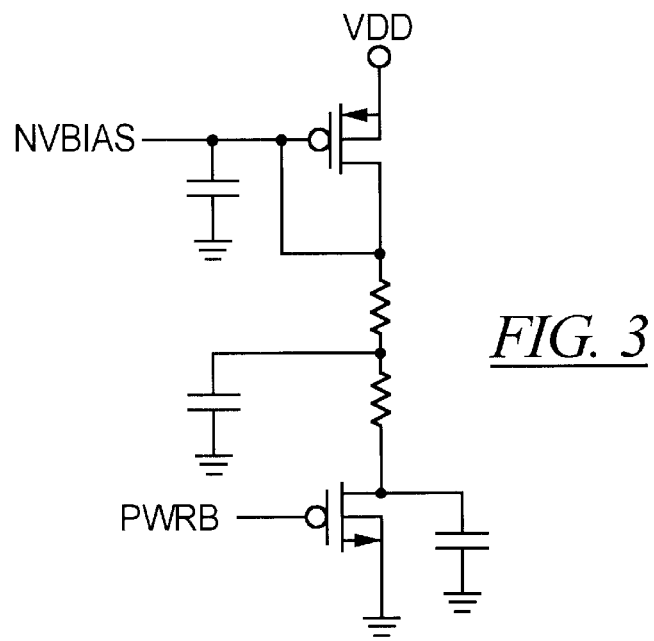
FIG. 3 illustrates a circuit for generating a signal NVBIAS for use by the CMOS ECL input buffer illustrated in FIG. 1; and, FIG. 4 illustrates a circuit for generating a signal NIBIAS for use by the CMOS ECL input buffer illustrated in FIG. 1.

The differential amplifier has outputs 150 and 152. The output 150 of the differential amplifier 12 is coupled to the gate of the transistor 130, and the output 152 of the differential amplifier 12 is coupled to the gate of the transistor 142. Accordingly, the output 150 drives the transistor 130, and the output 152 drives the transistor 136 through the transistors 142 and 144. The cascode section of the amplifier includes the transistors 22 and 26 along with their NVBIAS biases as shown in FIG. 3.

As discussed above, the reference is supplied by the reference circuit 60 to one side of the differential amplifier 12 and is nominally set at the midpoint of the voltage swing of the input signal IN. The input signal IN is supplied to the other side of the differential amplifier 12. With this arrangement, as the input signal IN traverses the reference voltage, the differential amplifier 12 causes the output signal OUT to swing rail to rail.

Figure 2:
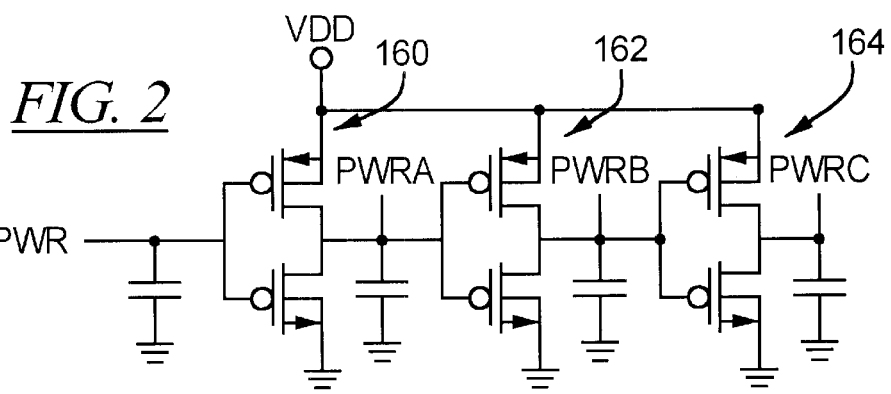
FIG. 2 illustrates a circuit for generating a signal PWRC for use by the CMOS ECL input buffer illustrated in FIG. 1.
Figure 4:
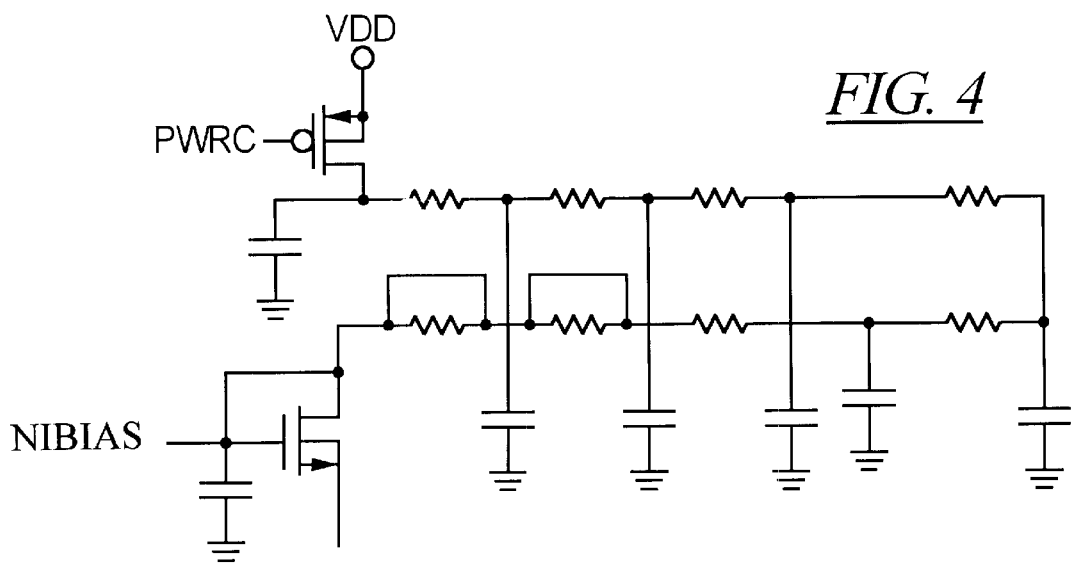

As shown in FIG. 2, the signal PWRC is derived from a signal PWR, which is a signal that drives the CMOS ECL input buffer 10 active and inactive. The signal PWR is supplied through a first inverter 160 to produce a signal PWRA. The signal PWRA is supplied through a second inverter 162 to produce a signal PWRB that is used in the arrangement of FIG. 3. Finally, the signal PWRB is supplied through a third inverter 164 to produce the signal PWRC that is used in the arrangement of FIG. 4. As shown in FIG. 3, the signal NVBIAS is derived from a signal PWRB, and as shown in FIG. 4, the signal NIBIAS is derived from the signal PWRC.

The CMOS ECL input buffer 10 uses only one negative power supply at a voltage that is well below that used by typical ECL. Therefore, the CMOS ECL input buffer 10 is tolerant of total dose radiation. Also, the reference circuit 60 and the input terminal 108 are coupled through p-channel source followers so that an adequately high bias is provided for the differential amplifier 12. The amplifier load has a cascode section in order to reduce transistor drain-to-source and gate-to-drain voltages so that the CMOS ECL input buffer 10 is compatible with rated voltages for 0.35 micron processes. The differential amplifier 12 has a cross-coupled active load to provide a very high voltage gain near the balance point between the reference and the signal IN. The reference circuit 60 has an on-chip capacitor to filter out ground noise from simultaneous switching of CMOS circuits on the same chip.

Except for the transistor 86, the capacitors shown in FIGS. 1, 2, 3, and 4 are parasitic capacitors.

Certain modifications of the present invention will occur to those practicing in the art of the present invention. For example, the CMOS ECL input buffer 10 is described above as being a single chip. However, the CMOS ECL input buffer 10 may be split between two or more chips, and/or one or more components of the CMOS ECL input buffer 10 may be provided off-chip.

Accordingly, the description of the present invention is to be construed as illustrative only and is for the purpose of teaching those skilled in the art the best mode of carrying out the invention. The details may be varied substantially without departing from the spirit of the invention, and the exclusive use of all modifications which are within the scope of the appended claims is reserved.

I claim:

1. A CMOS ECL input buffer having a buffer input and a buffer output, wherein the buffer input is arranged to receive an input signal from an ECL circuit, wherein the buffer output is arranged to provide an output signal to a CMOS circuit in response to the input signal from the ECL circuit, the CMOS ECL input buffer comprising:
   a CMOS differential amplifier having first and second inputs and an output;
   a CMOS input circuit coupled between the buffer input and the first input of the CMOS differential amplifier, wherein the CMOS input circuit is arranged to couple the input signal to the first input of the CMOS differential amplifier, and wherein the input signal has an ECL input voltage swing;
   a reference circuit coupled to provide a reference to the second input of the CMOS differential amplifier, wherein the reference is nominally set at substantially a midpoint of the ECL input voltage swing; and,
   a CMOS output circuit coupled between the output of the CMOS differential amplifier and the buffer output, wherein the CMOS output circuit is arranged to provide the output signal to the buffer output;
   wherein the output signal, in response to the CMOS differential amplifier, swings between a typical CMOS positive source voltage and ground as the input signal traverses the reference.

2. The CMOS ECL input buffer of claim 1 wherein the CMOS differential amplifier comprises a cross coupled active load providing a high voltage gain near a balance point between the reference and the input signal.

3. The CMOS ECL input buffer of claim 2 wherein the cross coupled active load comprises a cascode section.

4. The CMOS ECL input buffer of claim 2 wherein the CMOS input circuit comprises a p-channel source follower coupling the buffer input to the first input of the CMOS differential amplifier.

5. The CMOS ECL input buffer of claim 2 wherein the reference circuit comprises a p-channel source follower coupling the reference to the second input of the CMOS differential amplifier.

6. The CMOS ECL input buffer of claim 2 wherein the CMOS input circuit comprises a p-channel source follower coupling the buffer input to the first input of the CMOS differential amplifier, and wherein the reference circuit comprises a p-channel source follower coupling the reference to the second input of the CMOS differential amplifier.

7. The CMOS ECL input buffer of claim 2 wherein the reference circuit comprises a capacitor arranged to filter out ground noise caused by switching of CMOS circuits.

8. The CMOS ECL input buffer of claim 1 wherein the CMOS input circuit comprises a p-channel source follower coupling the buffer input to the first input of the CMOS differential amplifier.

9. The CMOS ECL input buffer of claim 1 wherein the reference circuit comprises a p-channel source follower coupling the reference to the second input of the CMOS differential amplifier.

10. The CMOS ECL input buffer of claim 1 wherein the CMOS input circuit comprises a p-channel source follower coupling the buffer input to the first input of the CMOS differential amplifier, and wherein the reference circuit comprises a p-channel source follower coupling the reference to the second input of the CMOS differential amplifier.

11. The CMOS ECL input buffer of claim 1 wherein the reference circuit comprises a capacitor arranged to filter out ground noise caused by switching of CMOS circuits.

12. The CMOS ECL input buffer of claim 11 wherein the CMOS input circuit comprises a p-channel source follower coupling the buffer input to the first input of the CMOS differential amplifier.

13. The CMOS ECL input buffer of claim 11 wherein the reference circuit comprises a p-channel source follower coupling the reference to the second input of the CMOS differential amplifier.

14. The CMOS ECL input buffer of claim 11 wherein the CMOS input circuit comprises a p-channel source follower coupling the buffer input to the first input of the CMOS differential amplifier, and wherein the reference circuit comprises a p-channel source follower coupling the reference to the second input of the CMOS differential amplifier.

15. The CMOS ECL input buffer of claim 1 having a single positive power supply and a single negative power supply, wherein the positive power supply has a typical CMOS power supply positive voltage, and wherein the negative power supply has a typical termination line power supply negative voltage.

16. A CMOS ECL input buffer chip having a buffer input and a buffer output, wherein the buffer input is arranged to receive an input signal from an ECL circuit, wherein the buffer output is arranged to provide an output signal to a CMOS circuit in response to the input signal from the ECL circuit, the CMOS ECL input buffer chip comprising:
   a CMOS amplifier having a cross coupled active load, first and second inputs, and an output, wherein the cross coupled load includes a cascode section;
   a first p-channel source follower coupling the buffer input to the first input of the CMOS amplifier;
   a second p-channel source follower coupling a reference to the second input of the CMOS amplifier; and,
   a capacitor arranged to filter out ground noise due to simultaneous switching of CMOS circuits on the CMOS ECL input buffer chip.

17. The CMOS ECL input buffer chip of claim 16 wherein the CMOS amplifier comprises a CMOS differential amplifier.

18. The CMOS ECL input buffer chip of claim 16 having a single positive power supply and a single negative power supply, wherein the positive power supply has a typical CMOS power supply positive voltage, and wherein the negative power supply has a typical termination line power supply negative voltage.

19. A method of buffering a signal between an input ECL circuit and an output CMOS circuit comprising:

level shifting an input signal up through a p-channel source follower and supplying the level shifted input signal to a first input of a CMOS differential amplifier, wherein the input signal is from the input ECL circuit, and wherein the input signal has an input signal swing;

level shifting a reference up through a p-channel source follower and supplying the level shifted reference to a second input of the CMOS differential amplifier, wherein the reference is substantially midway in the input signal swing; and, coupling an output of a cross coupled active load of the CMOS differential amplifier to an output terminal connected to the output CMOS circuit, wherein the cross coupled active load provides a high gain at a balance point between the input signal and the reference.

20. The method of claim 19 wherein the coupling of an output of a cross coupled active load of the CMOS differential amplifier to an output terminal comprises coupling the output of a cascode section of the cross coupled active load of the CMOS differential amplifier to the output terminal.

21. The method of claim 19 performed on a single chip having only one positive power supply and only one negative power supply, wherein the one positive power supply has a typical CMOS power supply positive voltage, and wherein the one negative power supply has a typical termination line power supply negative voltage.

22. The method of claim 19 performed on a single chip, wherein the method further comprises filtering ground noise through an on-chip capacitor, and wherein the ground noise is caused by simultaneous switching of CMOS circuits on the chip.

* * * * *